(12) United States Patent
Shimizu (10) Patent No.: US 8,183,600 B2
(45) Date of Patent: May 22, 2012

(54) SEMICONDUCTOR INTEGRATED CIRCUIT DEVICE WITH REDUCED CELL SIZE

(75) Inventor: Hiroharu Shimizu, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 115 days.

(21) Appl. No.: 12/632,088

(22) Filed: Dec. 7, 2009

(65) Prior Publication Data

US 2010/0148219 A1  Jun. 17, 2010

(30) Foreign Application Priority Data

Dec. 12, 2008  (JP) ................... 2008-316965

(51) Int. Cl.
 *H01L 27/10* (2006.01)
(52) U.S. Cl. ........ 257/207; 257/206; 257/208; 257/210; 257/401; 257/E27.013; 257/E27.026
(58) Field of Classification Search ............ 257/206, 257/207, 401, E27.013, E27.026, 208, 210
See application file for complete search history.

(56) References Cited

U.S. PATENT DOCUMENTS

| | | | | |
|---|---|---|---|---|
| 6,385,761 B1 * | 5/2002 | Breid | ........... | 716/104 |
| 6,477,696 B2 * | 11/2002 | Tien | ........... | 716/130 |
| 6,867,465 B2 * | 3/2005 | Dono | ........... | 257/401 |
| 7,747,976 B2 * | 6/2010 | Liao | ........... | 716/130 |
| 2002/0007478 A1 * | 1/2002 | Tien | ........... | 716/2 |
| 2006/0202231 A1 | 9/2006 | Yamamoto | | |
| 2008/0094870 A1 * | 4/2008 | Tsujimura et al. | ........... | 365/72 |
| 2008/0169487 A1 * | 7/2008 | Shimbo et al. | ........... | 257/207 |

FOREIGN PATENT DOCUMENTS

| | | |
|---|---|---|
| JP | 2006-228982 A | 8/2006 |
| JP | 2006-253375 A | 9/2006 |

\* cited by examiner

*Primary Examiner* — Andy Huynh
(74) *Attorney, Agent, or Firm* — Miles & Stockbridge P.C.

(57) ABSTRACT

A technique permitting reduction in size of a standard cell is provided. In a semiconductor integrated circuit device comprising a first tap formed in a first direction to supply a power-supply potential, a second tap formed in the first direction to supply a power-supply potential and positioned so as to confront the first tap in a second direction intersecting the first direction, and a standard cell formed between the first and second taps, a cell height (distance) between the center of the first tap and that of the second tap both in the second direction is set to ((an integer+0.5)×a wiring pitch of the second-layer wiring lines) or [(an integer+0.25)×a wiring pitch of the second-layer wiring lines].

6 Claims, 9 Drawing Sheets

|         | 65 nm   | 45 nm    |
|---------|---------|----------|
| 7 PITCH | 714 row | 1020 row |
| 6.5 PITCH | 769 row | 1098 row |

SEMICONDUCTOR INTEGRATED CIRCUIT DEVICE WITH REDUCED CELL SIZE

CROSS-REFERENCE TO RELATED APPLICATIONS

The disclosure of Japanese Patent Application No. 2008-316965 filed on Dec. 12, 2008 including the specification, drawings and abstract is incorporated herein by reference in its entirety.

BACKGROUND OF THE INVENTION

The present invention relates to a semiconductor integrated circuit device and more particularly to a technique effectively applicable to a semiconductor integrated circuit device having a function device including a cell array which comprises a plurality of standard cells.

Heretofore, in designing the layout of a semiconductor integrated circuit device, diffusion layers for power supply are extended in one direction and a MOS transistor which constitutes a desired circuit is disposed between the diffusion layers. This arrangement is recognized as a cell. An example of layout of such a cell is described, for example, in Japanese Unexamined Patent Publication No. 2006-253375 (Patent Literature 1). The diffusion layers for power supply formed to extend in one direction are each sometimes called "tap."

Reference is also made here to Japanese Unexamined Patent Publication No. 2006-228982 (Patent Literature 2). According to the technique disclosed therein, in a semiconductor integrated circuit including a plurality of standard cells having diffusion layers for forming circuits, the diffusion layers for circuit in the standard cells adjacent to each other are arranged at a predetermined diffusion layer spacing, and in the case where the diffusion layers for circuit are formed at mutually different phases by phase shift, there are discontinuously formed diffusion layers for tap to draw a power-supply potential or a ground potential in the vicinity of the adjacent diffusion layers for circuit. By so doing, patterns are highly integrated without lowering the resolution of the patterns and without causing any such problem as phase contradiction.

[Patent Literature 1]
Japanese Unexamined Patent Publication No. 2006-253375

[Patent Literature 2]
Japanese Unexamined Patent Publication No. 2006-228982

SUMMARY OF THE INVENTION

The cell height is determined by the number of wiring lines capable of passing over a standard cell in a direction parallel to taps. Particularly, on the basis of the wiring pitch (grid, track) of the second-layer or more layer wiring lines, the cell height is determined from the consistency with the wiring lines. By the wiring pitch is meant the sum of wiring width and wiring spacing. There is used a concept such that an integer multiple of the wiring pitch is the cell height, because there is attained an excellent wiring consistency and there occurs any wasteful gap with respect to wiring.

Figure 10:
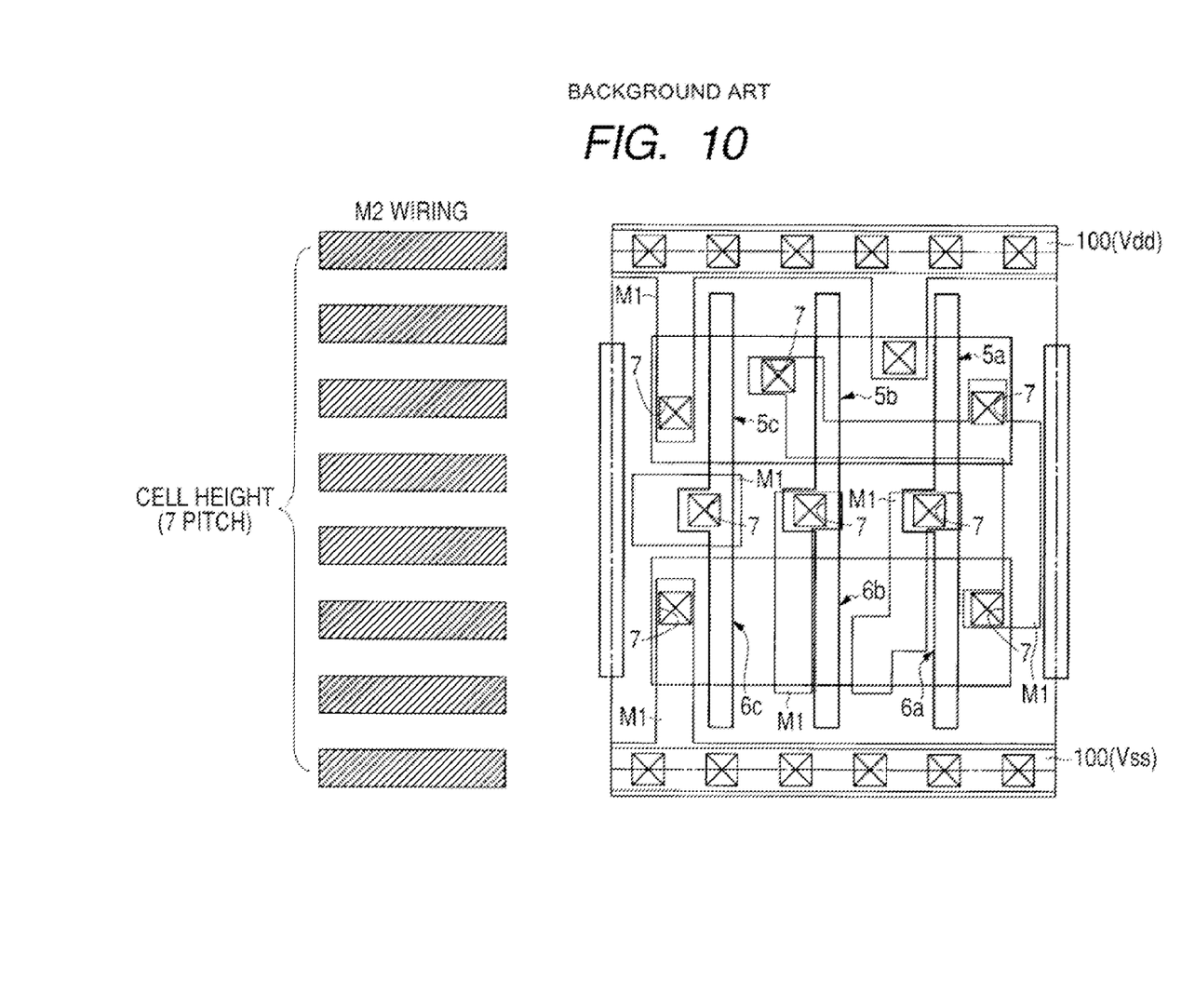
FIG. 10 is a plan view of a principal portion of a standard cell having a height corresponding to an integer multiple of a wiring pitch about which the present inventors have studied.

FIG. 10 is a plan view of a standard cell having a cell height corresponding to an integer multiple of the wiring pitch. In the illustrated standard cell, a seven-line pitch is referred to as an example. More specifically, six second-layer lines M2 can pass between taps 100 which are disposed up and down respectively. Seven second-layer lines M2 can pass, adding a second-layer line M2 located over one tap 100.

According to this technique, however, although the layout rule permits a smallest formation of a primitive circuit within the standard cell, the primitive circuit must be disposed in an area defined by an integer multiple of the wiring pitch. Thus, it cannot always be said that the standard cell is designed in a minimum unit. That is, although the semiconductor element itself formed in the standard cell can be microfabricated to a further extent, it cannot always be said that a minimum-unit microfabrication is attained, because the cell height is defined in terms of the wiring pitch.

It is an object of the present invention to provide a technique able to reduce the size of standard cell.

The above and other objects and novel features of the present invention will become apparent from the following description and the accompanying drawings.

The following is a brief description of a typical embodiment of the present invention as disclosed herein.

According to this embodiment there is provided a semiconductor integrated circuit device comprising a first tap for the supply of a first potential, the first tap being formed in a first direction, a second tap for the supply of a second potential, the second tap being formed in the first direction and positioned so as to confront the first tap in a second direction intersecting the first direction, and a cell array comprising a plurality of standard cells each formed and arranged between the first tap and the second tap, a cell height between the center of the first tap in the second direction and the center of the second tap in the second direction being set at [(an integer+0.5)×a second-layer wiring pitch] or [(an integer+0.25)×a second-layer wiring pitch].

Effect of the Invention

An effect obtained by the typical embodiment of the present invention as disclosed herein will be outlined below.

The semiconductor integrated circuit device having standard cells can be reduced in size.

DETAILED DESCRIPTION OF THE PREFERRED EMBODIMENTS

The following embodiments will each be described dividedly into plural sections or embodiments where required for the sake of convenience, but unless otherwise specified, it is to be understood that they are not unrelated to each other, but one is in a relation of modification or detailed or supplementary explanation of part or the whole of the other.

When reference is made, for example, to the number of elements (including the number of pieces, numerical value, quantity, and range) in the following embodiments, no limitation is made to the specified number, but numbers above and below the specified number will do unless otherwise specified and except the case where limitation is made to the specified number basically clearly. In the following embodiments, moreover, it goes without saying that their constituent elements (including constituent steps) are not always essential unless otherwise specified and except the case where they are considered essential basically clearly. Likewise, in the following embodiments, it is to be understood that when reference is made to the shape and positional relation of a constituent element, those substantially similar or closely similar thereto are also included unless otherwise specified and except the case where the answer is negative basically clearly. This is also true of the foregoing numerical value and range.

In the drawings used in the embodiments, even plan views may be hatched to make theme easier to see. In the following embodiments, MISFET (Metal Insulator Semiconductor Field Effect Transistor) which represents the field effect transistor is abbreviated MIS; likewise, p- and n-channel type MISFETs are abbreviated pMIS and nMIS, respectively.

In all of the drawings for illustrating the embodiments, portions having the same functions are identified by the same reference numerals and repeated explanations thereof will be omitted in principle. Embodiments of the present invention will be described below in detail with reference to the drawings.

Figure 1:
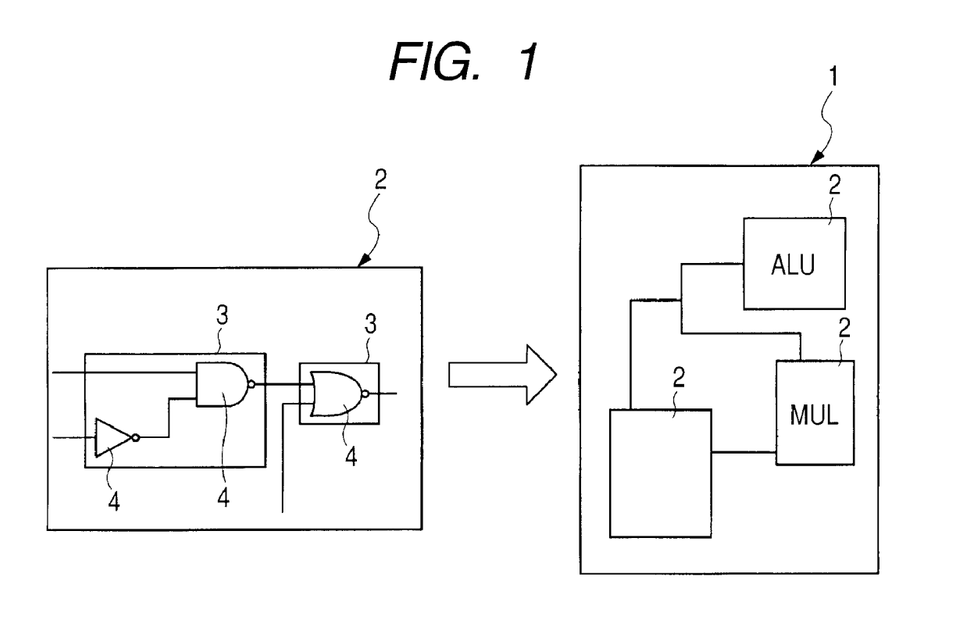
FIG. 1 is a schematic diagram showing an example of configuration of a semiconductor integrated circuit device according to a first embodiment of the present invention.
Figure 2:
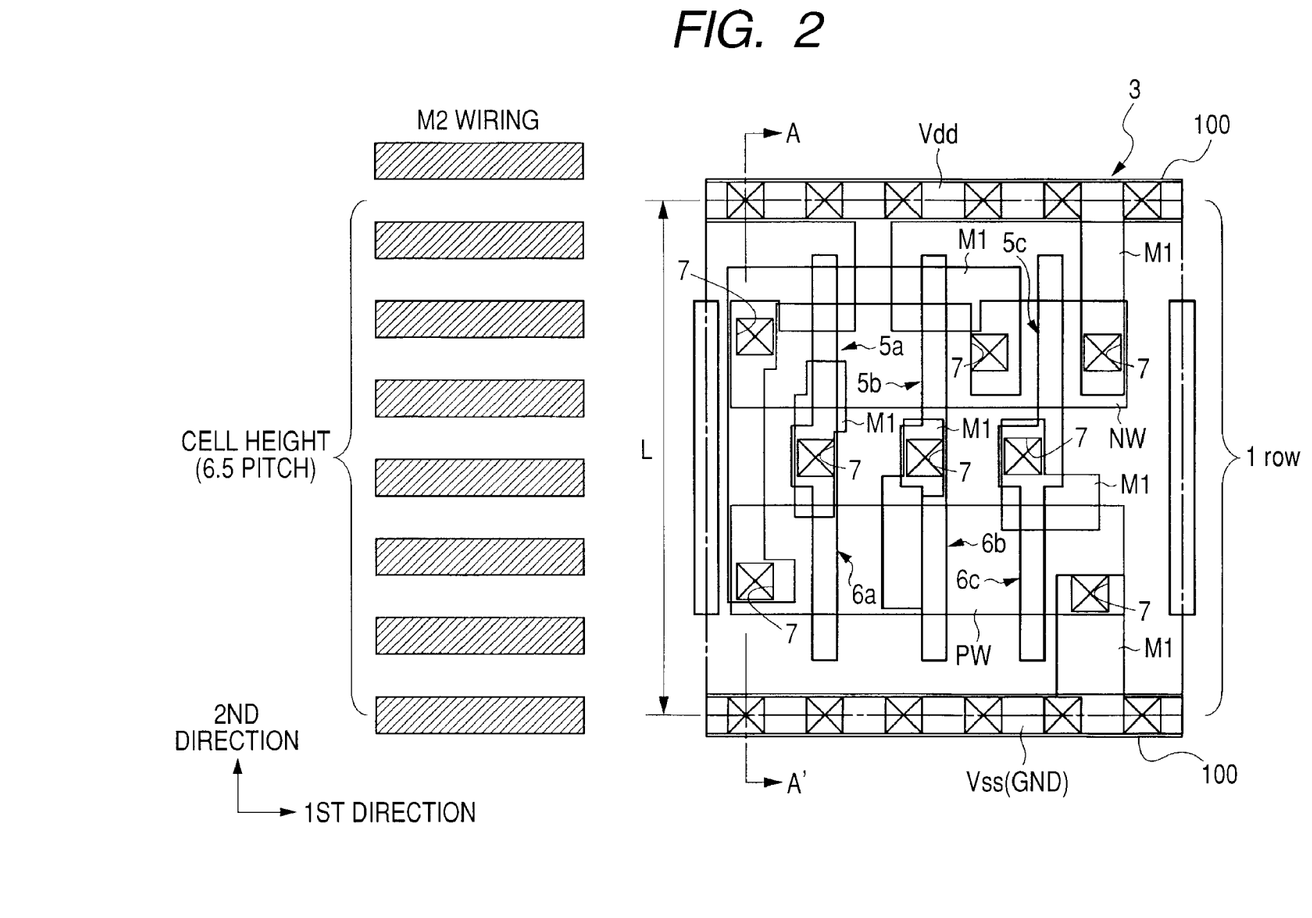
FIG. 2 is a plan view of a principal portion of one standard cell (1 row) in the first embodiment.

In the following embodiments, diffusion layers for power supply formed so as to extend in one direction are each designated "tap." Plural MISFETs are arranged between upper and lower taps and they constitute part of a desired circuit. The standard cell referred to above indicates those MISFETs coupled together by first-layer wiring. For example, a three-input NAND circuit standard cell shown in FIG. 2 is comprised of taps 100 disposed up and down respectively, six MISFETs (pMIS 5a, 5b, 5c and nMIS 6a, 6b, 6c) each having a gate electrode, a source region and a drain region, and first-layer wiring lines M1 for coupling the MISFETs. As the wiring lines for coupling the MISFETs there may be used, if necessary, second-layer wiring lines M2 or still higher-layer wiring lines. In the case where standard cells are adjacent to each other in the cell height direction, a tap is common to the vertically adjacent cells and two taps 100 are not disposed adjacent each other.

The cell height is equal to the cell length in the direction orthogonal to the taps. It corresponds to the distance from the center of the tap located at one end of one cell to the center of the tap located at the opposite end of that cell. In other words, it corresponds to the distance from the center of a contact hole formed in one-end tap to the center of a contact hole formed in the opposite-end tap.

In the following embodiments reference will be given, as an example of cell, to a standard cell wherein six second-layer wiring lines M2 can pass between the upper and lower taps 100.

(First Embodiment)

A primitive circuit which constitutes the standard cell used in this first embodiment is a fundamental logic circuit or a fundamental function circuit, e.g., NAND, NOR, EOR (Exclusive OR:XOR), ENOR, Flip/Flop, Multiplexer, Inverter, or Buffer.

The semiconductor integrated circuit according to this first embodiment is provided with a function unit, e.g., Arithmetic Logical Unit (ALU) or Multiplier (MUL), formed by disposing and wiring library-registered standard cells onto a semiconductor chip.

The semiconductor integrated circuit device, indicated at 1, is comprised of plural function units 2 such as ALUs or MULs. Each function unit 2 includes a cell array which is formed by arranging and wiring plural standard cells 3. The standard cell 3 is each a standardized circuit block comprising one or plural primitive circuits 4. By making the cell height (circuit block height) uniform it is possible to facilitate the arranging and wiring of the standard cells 3. For coupling the standard cells 3 with each other there is used the second-layer or higher-layer wiring. For coupling the primitive circuits 4 with each other in each standard cell and for coupling in each primitive circuit there is used the first-layer wiring.

Figure 3:
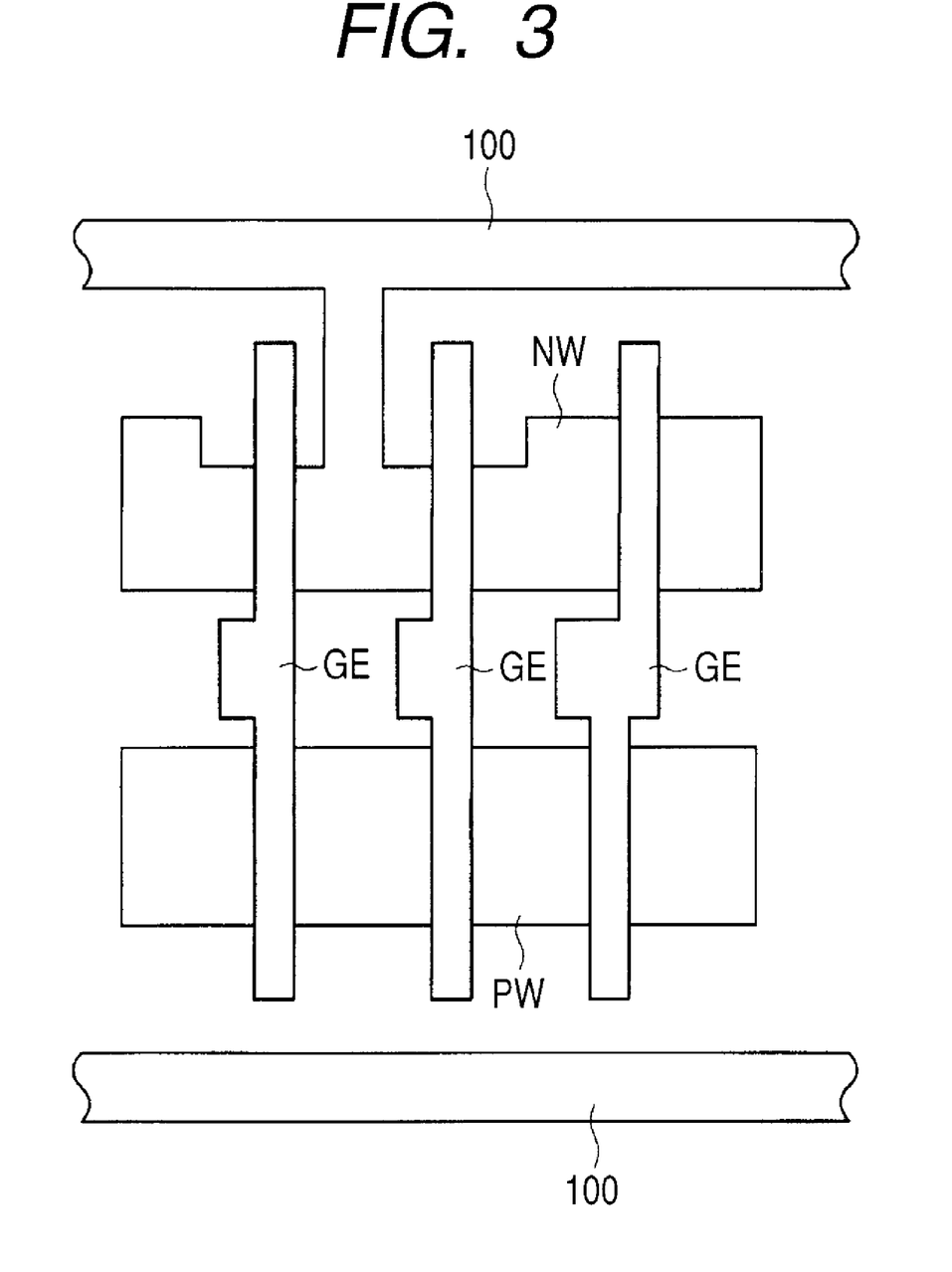
FIG. 3 is a schematic diagram showing only active regions and gate electrodes in FIG. 2.
Figure 4:
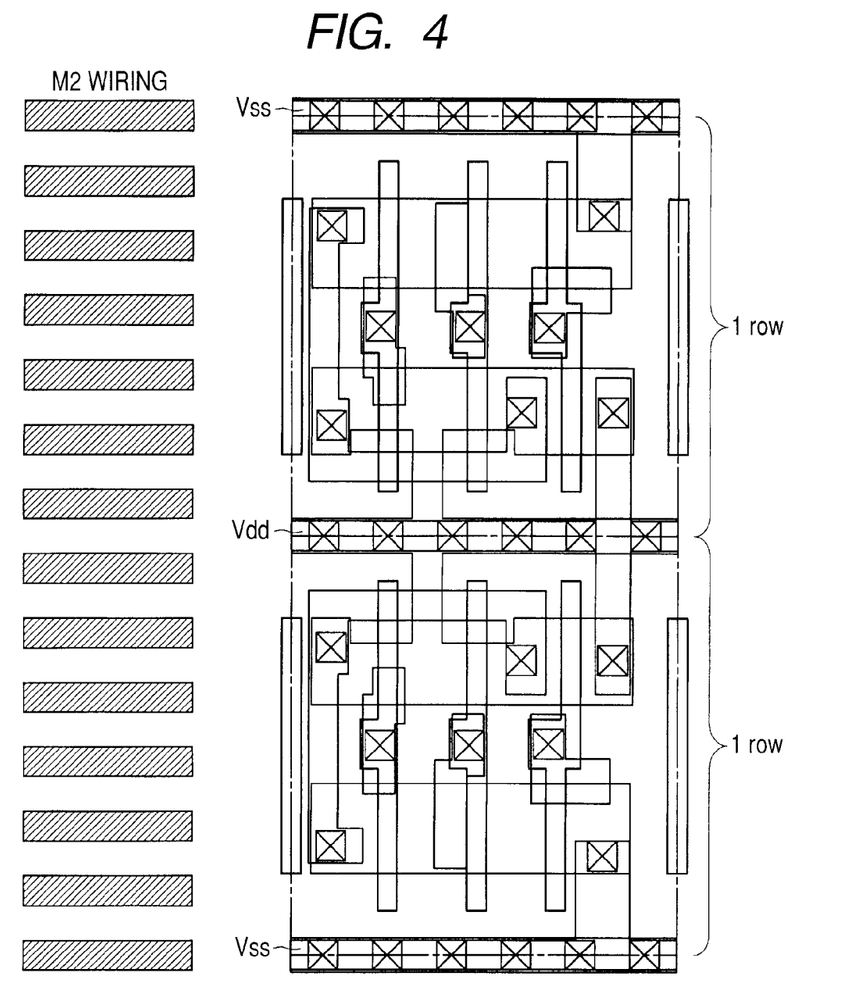
FIG. 4 is a plan view of a principal portion of two adjacent standard cells (2 rows) in the first embodiment.

FIG. 2 is a plan view of a principal portion of one standard cell (1 row) in the first embodiment. FIG. 3 is a simplified illustration of FIG. 2, with the first-layer lines M1 and contact holes 7 being omitted, showing only active regions and gate electrodes GE partitioned by element isolation regions 8. FIG. 4 is a plan view of a principal portion of two adjacent standard cells (2 rows) in the first embodiment. As a primitive circuit which constitutes each standard cell, FIG. 2 illustrates a 3-input NAND circuit and FIG. 4 illustrates two 3-input NAND circuits, but no limitation is made thereto. The patterns shown on the right side of FIGS. 2 and 4 represent the number of wiring lines able to pass in the direction parallel to the taps 100. In the 3-input NAND circuit, as shown in FIG. 2, three pMIS 5a, 5b and 5c are formed in an n-type well region NW formed in a semiconductor substrate, while three nMIS 6a, 6b and 6c are formed in a p-type well region PW formed in the semiconductor substrate. A gate electrode of pMIS 5a and a gate electrode of nMIS 6a are formed by a common conductor film and are coupled electrically to a first-layer wiring line M1 through a contact hole 7 formed in contact with the said conductor film. Likewise, a gate electrode of pMIS 5b and a gate electrode of nMIS 6b are formed by a common conductor film and are coupled electrically to a first-layer wiring line M1. A gate electrode of pMIS 5c and a gate electrode of nMIS 6c are formed by a common conductor layer and are coupled electrically to a first-layer wiring line M1.

Figure 9:
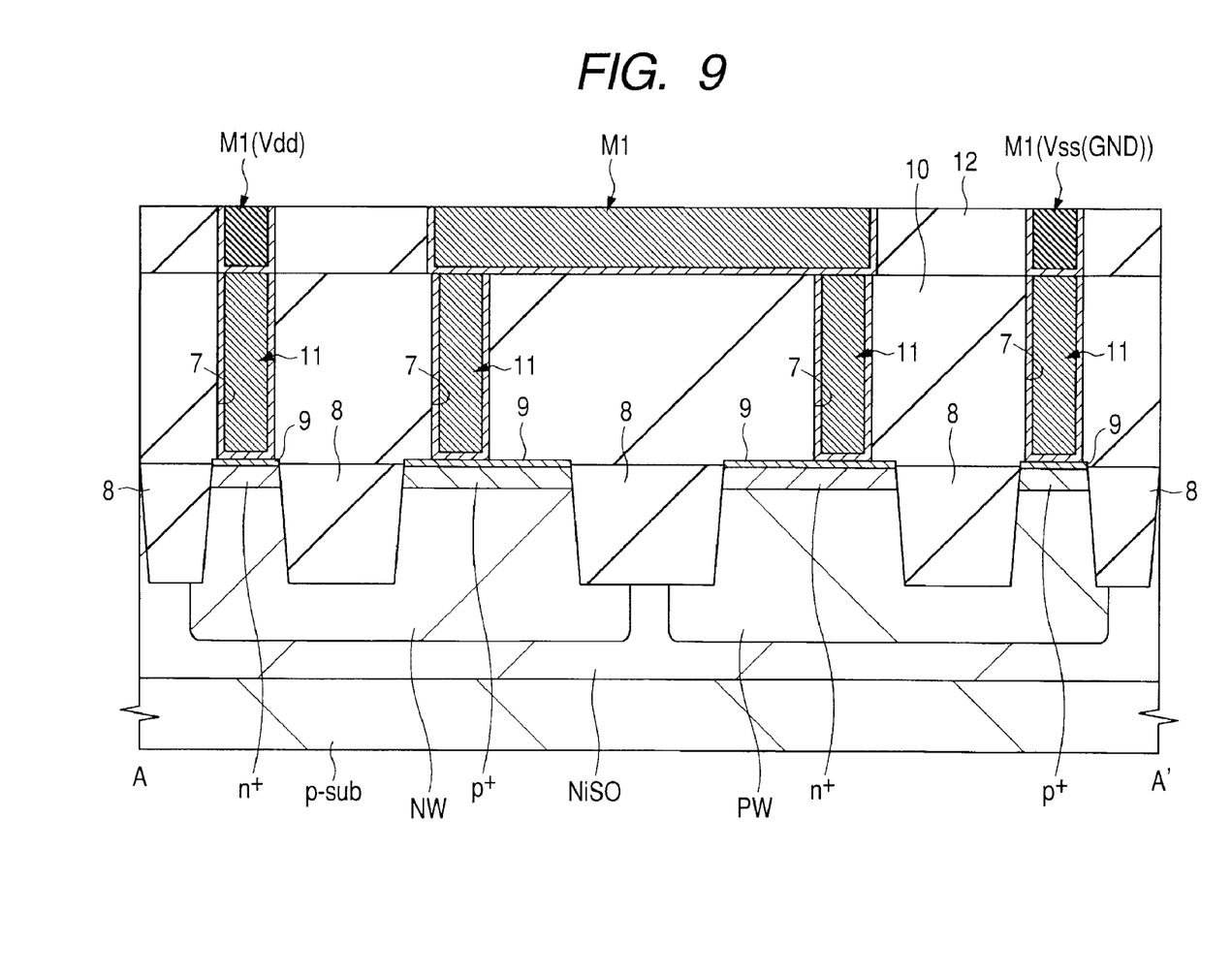
FIG. 9 is a sectional view of a principal portion taken along line A-A' in FIG. 2.

FIG. 9 is a sectional view of a principal portion taken along line A-A' in FIG. 2. An n-type semiconductor region NiSO is formed in a p-type semiconductor region p-sub and a well region to be formed with each semiconductor elements is isolated by the n-type semiconductor region NiSO. Both n-type well region NW and p-type well region PW are formed in the n-type semiconductor region NiSO.

In the p-type semiconductor substrate p-sub there are formed element isolation regions 8, whereby there are partitioned active regions with semiconductor elements mainly formed therein. The element isolation regions 8 are each formed by burying an insulating film such as silicon oxide film into a trench formed in the p-type semiconductor substrate p-sub. In FIGS. 2 and 3, p-type well region PW, n-type well region NW and taps 100 are shown as active regions.

In the n-type well region NW are formed plural p-channel field effect transistors (pMIS), while in the p-type well region PW are formed plural n-channel field effect transistors (nMIS). The pMIS and nMIS are each provided with a gate insulating film formed on the p-type semiconductor substrate p-sub, a gate electrode GE formed on the gate insulating film, and source and drain regions formed within the p-type semiconductor substrate p-sub. The gate insulating film is formed, for example, by silicon oxide film. The gate electrode GE is formed by a conductive film, e.g., polycrystalline silicon film. The gate electrode of each pMIS and that of each nMIS are formed integrally using the same conductive film. An n-type conductive impurity such as phosphorus or arsenic is introduced into the gate electrode GE on the p-type well region PW, while a p-type conductive impurity such as boron or boron fluoride is introduced into the gate electrode GE on the n-type well region NW.

The source or drain region of each pMIS comprises a low concentration p-type semiconductor region and a high concentration p-type semiconductor region p+ both formed in the n-type well region NW. In this first embodiment, for the simplification of explanation, there is made no illustration in the gate length direction of pMIS and hence the low concentration n-type semiconductor region is not illustrated. In FIG. 9 which is a sectional view taken along line A-A' of FIG. 2, there is shown a p-type semiconductor region p+ which is the drain region of pMIS. The surface of the tap 100 of a power-supply potential Vdd is formed with an n-type semiconductor region n+ of a high concentration, the region n+ being formed in the n-type well region NW. This region is formed in the same process as the process of forming the source and drain regions of nMIS. The tap 100 is configured to supply the line potential Vdd to the n-type well region NW with pMIS formed therein and fix the potential of the same region to a constant potential. Silicide film 9 is formed on the surface of each of the high concentration p-type semiconductor region p+, the high concentration n-type semiconductor region n+ and the gate electrode GE of pMIS. For example, the silicide film is formed by nickel silicide film, cobalt silicide film or platina silicide film. Thereafter, an interlayer insulating film 10 is formed which covers those regions, contact holes 7 are formed within the interlayer insulating film 10, and plugs 11 are formed within the contact holes 7 respectively. The plugs 11 are each formed by a titanium or titanium nitride film or a laminated film of those materials.

The source or drain region of nMIS comprises a low concentration n-type semiconductor region and a high concentration n-type semiconductor region n+ both formed in the p-type well region PW. In this first embodiment, for simplifying explanation, there is not made illustration in the gate length direction of nMIS and hence the low concentration n-type semiconductor region is not illustrated. In FIG. 9 which is a sectional view taken along line A-A' of FIG. 2, there is shown an n-type semiconductor region n+ which is the drain region of nMIS. The surface of the tap 100 of a power-supply potential Vss is formed with a high concentration p-type semiconductor region p+, the p-type semiconductor region p+ being formed in the p-type well region PW. This region is formed in the same process as the process of forming the source and drain regions of pMIS. The tap 100 is configured to supply the power-supply potential Vss to the p-type well region PW with nMIS formed therein and fix the potential of the same region to a constant potential. Silicide film 9 is formed on the surface of each of the high concentration n-type semiconductor region n+, the high concentration p-type semiconductor region p+ and the gate electrode GE of nMIS. For example, the silicide film is formed by nickel silicide film, cobalt silicide film, or platina silicide film. Thereafter, an interlayer insulating film 10 is formed which covers those regions, contact holes 7 are formed within the interlayer insulating film 10 and plugs 11 are formed within the contact holes 7 respectively. The plugs 11 are each formed by a titanium or titanium nitride film or a laminated film of those materials.

In FIG. 2, the source region of a certain pMIS is extended up to the tap 100 of the power-supply potential Vdd, whereby the power-supply potential Vdd is coupled directly to the source region using the silicide film without using a wiring layer. In this case, since a wiring layer is not used, it is possible to enhance the degree of freedom of the wiring layout. Even if this arrangement is applied to the source region of nMIS, there will be obtained the same effect although this first embodiment refers to the source region of pMIS.

For the purpose of increasing the driving current of nMIS, the width of the p-type well region PW may be set larger than that of the n-type well region NW in the vertical direction (A-A' direction) in FIG. 2.

The source of pMIS 5c is electrically coupled through the first-layer wiring line M1 to the line potential Vdd (a power supply semiconductor region (first tap)) which is formed in the first direction, while the sources of pMIS 5a and 5b are coupled electrically to the line potential Vdd through the semiconductor region. The drains of pMIS 5a, 5b and 5c are coupled electrically to the drain of nMIS 6a through the first-layer wiring line M1. The source of nMIS 6c is electrically coupled through the first-layer wiring line M1 to the line potential Vss (a power supply semiconductor region (second tap) which is formed in the first direction. The line potential Vss can be made a reference potential (ground potential) GND.

Thus, the first-layer wiring lines M1 are used for mutual coupling among the three pMIS 5a, 5b, 5c and three nMIS 6a, 6b, 6c as constituents of the 3-input NAND circuit. The first-layer wiring lines M1 are each formed by burying a barrier metal film and a conductive film mainly formed of copper into a trench formed in the interlayer insulating film 12. The barrier metal film is formed by a tantalum or tantalum nitride film or a laminated film of those materials. The same configuration also applies to the second- and higher-layer wiring lines. Although wiring lines and plugs are formed separately in this first embodiment, both may be formed in an integrally combined manner by first forming trenches for contact holes and wiring lines and then burying a barrier metal film and a copper-based conductive film into each of the trenches.

As shown in FIG. 4, in case of coupling two standard cells adjacent each other in the cell height direction, the coupling is done using a wiring line extending in a direction crossing a tap 100 and passing over the tap 100. As such a wiring line there may be used a first-layer wiring line M1 or a second-layer wiring line M2. That is, the wiring line for coupling the standard cells is different from the wiring lines used to fabricate desired circuits in the standard cells.

As noted above, the cell height of each standard cell 3 described in this first embodiment is determined by the number of the second- and higher-layer wiring lines capable of passing between the first and second taps (over the standard cell).

The cell height indicates the cell length in the second direction orthogonal to the first direction, corresponding to the distance L from the center of the semiconductor region (first tap) for power supply which supplies the line potential Vdd up to the center of the semiconductor region (second tap) for power supply which supplies the line voltage Vss. In other words, it is the distance from a contact hole disposed in the first tap to the center of a contact hole disposed in the second tap.

However, unlike the foregoing standard cell shown in FIG. 10, the cell height is not an integer multiple of the wiring pitch. More particularly, the cell height corresponds to (an integer+one divided by the integer)×wiring pitch. The cell height in this first embodiment is set at (an integer+0.5)× wiring pitch. The integer indicates the number of the second- and higher-layer wiring lines able to pass between the first and second taps, particularly, the number of the second-layer wiring lines M2. The said wiring pitch indicates the second-layer wiring pitch. For example, in the case of the standard cell 3 shown in FIG. 2, the number of the second-layer wiring lines M2 able to pass between the first and second taps is six, so that the aforesaid integer is six and (6+0.5)×wiring pitch=6.5 wiring pitch corresponds to the cell height. The wiring pitch is a value obtained by adding the wiring width and the wiring spacing to each other. As the wiring pitch referred to in this first embodiment there is used a minimum wiring pitch obtained by adding together a wiring width and a wiring spacing each formed at a minimum machining size.

In the case where the cell height is made (an integer+0.5)× wiring pitch, the wiring pitch of the second-layer wiring lines M2 once assumes an integer value at a 2-cell stage (2 row), as shown in FIG. 4. Therefore, in the case of a cell array formed by disposing and wiring plural standard cells 3, it is possible to obtain the consistency between the second-layer wiring lines M2 and the cell height.

Thus, by setting the cell height at (an integer+0.5)×wiring pitch it is possible to reduce the area of the cell array in the direction orthogonal to the taps 100.

For example, in the case of a conventional layout including 1,000 second-layer wiring lines M2 arranged at equal intervals, with the cell height being an integer multiple of the wiring pitch, the cell height in case of the number of second-layer wiring lines M2 able to pass between the first and second taps being six becomes a 7-wiring pitch as shown above in FIG. 10. As a result, the number of cell steps in this case becomes 142 cell steps. On the other hand, in the case of a layout in this first embodiment which, for example, includes 1,000 second-layer wiring lines arranged at equal intervals and with the cell height being set at (an integer+0.5)×wiring pitch, the cell height in case of the number of second-layer wiring lines M2 able to pass between the first and second taps being six is a 6.5-wiring pitch. As a result, the number of cell steps in this case becomes 153 cell steps, showing an increase of about 7.7% in the number of cell steps as compared with the conventional layout. Consequently, under the same layout rule, the layout according to this first embodiment permits about 7% reduction in the area of cell layout as compared with the conventional layout.

Figure 5:
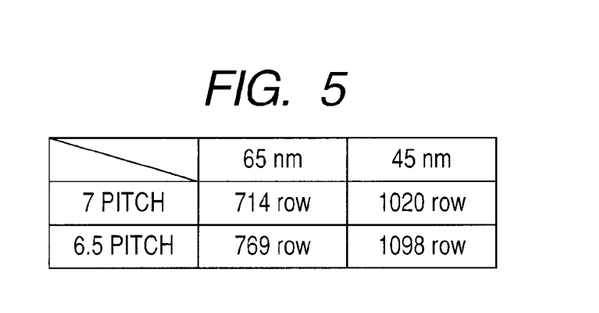
FIG. 5 is an explanatory diagram showing in a summarized manner an increase in the number of cell steps in the first embodiment.

Moreover, as shown in FIG. 5, by changing the cell height from the 7-wiring pitch (an integer multiple of the wiring pitch) to 6.5-wiring pitch ((an integer+0.5)×wiring pitch), the number of cell steps increases by about 7.7% irrespective of the minimum machining size.

(Second Embodiment)

According to the second embodiment of the present invention the cell height referred to in the previous first embodiment is set at (an integer+0.25)×wiring pitch.

Figure 6:
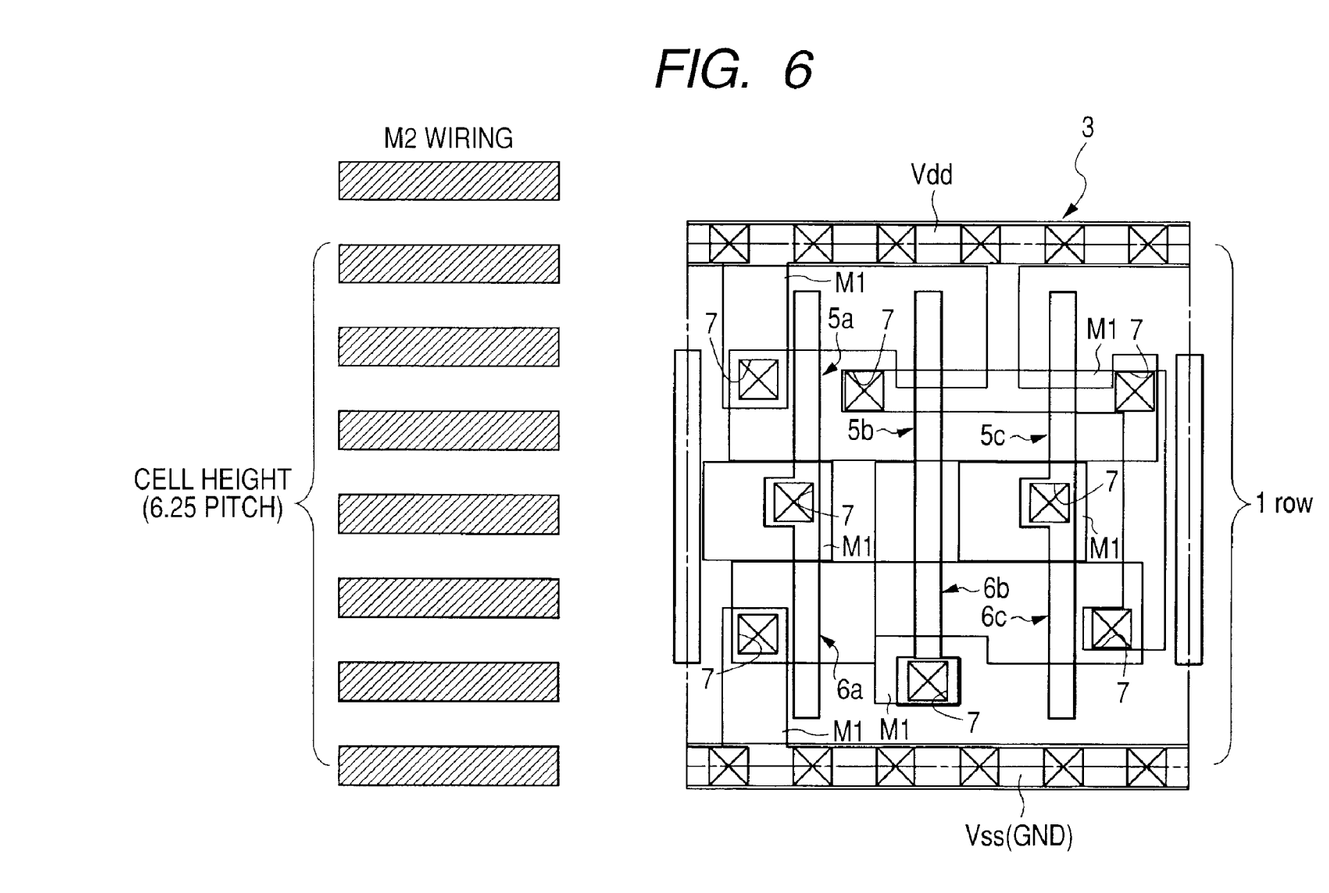
FIG. 6 is a plan view of a principal portion of one standard cell (1 row) in a second embodiment of the present invention.
Figure 7:
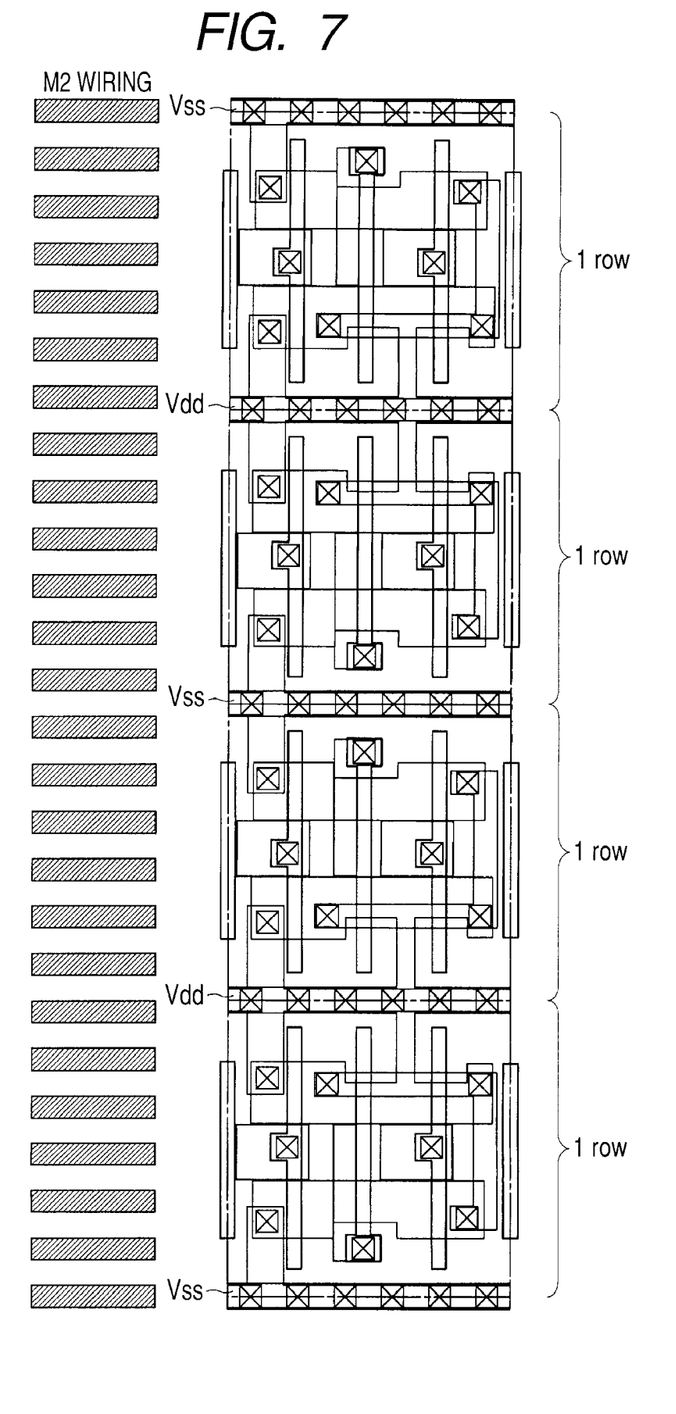
FIG. 7 is a plan view of a principal portion of four standard cells (4 rows) in the second embodiment.

FIG. 6 is a plan view of a principal portion of one standard cell (1 row) according to this second embodiment and FIG. 7 is a plan view of a principal portion of four adjacent standard cells (4 rows) according to this second embodiment. As a primitive circuit which constitutes each standard cell, a 3-input NAND circuit is illustrated in FIG. 6 and four 3-input NAND circuits are illustrated in FIG. 7, provided no limitation is made thereto. As in the first embodiment, in case of coupling two standard cells which are adjacent in the cell height direction, the coupling is effected using a wiring line extending in a direction crossing a tap 100 and passing over the tap 100. Such a wiring line may be a first-layer wiring line M1 or a second-layer wiring line M2. That is, the wiring line used to couple standard cells is separate from the wiring lines used to constitute desired circuits in the standard cells.

Although in the first embodiment the cell height is set at (an integer+0.5)×wiring pitch, in this second embodiment the cell height is set at (an integer+0.25)×wiring pitch.

The height of each standard cell 3 to be described in this second embodiment is determined by the number of second-layer or higher-layer wiring lines able to pass between the first and second taps (over the standard cell 3) as in the first embodiment, provided the cell height is set at (an integer multiple of wiring+0.25)×wiring pitch. By the integer is meant the number of second-layer or higher-layer wiring lines able to pass between the first and second taps, particularly the number of second-layer wiring lines M2. For example, in the case of the standard cell 3 shown in FIG. 6, since the number of second-layer wiring lines M2 able to pass between the first and second taps is six, the aforesaid integer multiple of wiring is six and therefore (6+0.25)×wiring pitch=6.25 wiring pitch is the cell height.

In case of setting the cell height at (an integer+0.25)× wiring pitch, as shown in FIG. 7, the wiring pitch of second-layer wiring lines M2 is four cell steps (4 rows), thus once assuming an integer. Accordingly, in the case of a cell array formed by arranging and wiring plural standard cells 3, it is possible to obtain consistency between the second-layer wiring lines M2 and the cell height.

Thus, by setting the cell height at (an integer+0.25)×wiring pitch it is possible to reduce the area of the cell array in the direction orthogonal to the taps 100.

Figure 8:
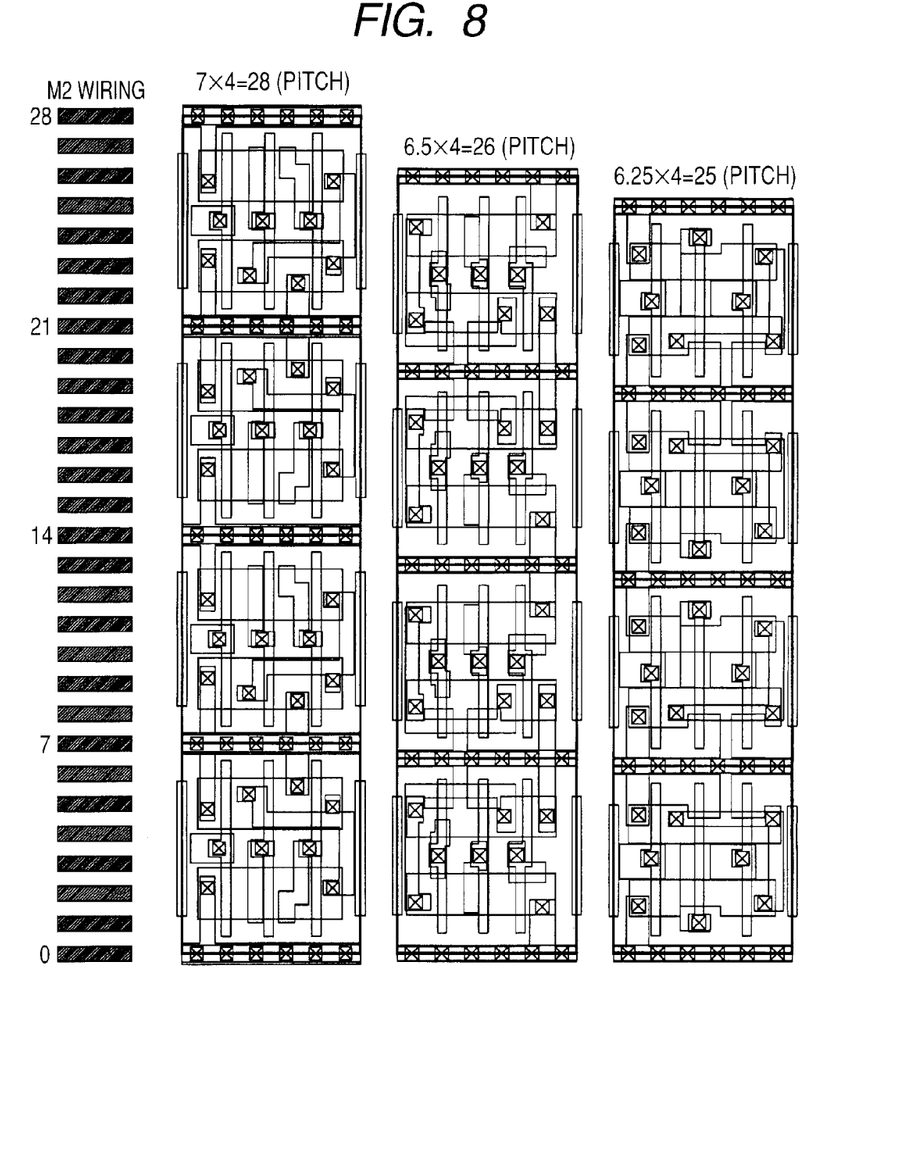
FIG. 8 is an explanatory diagram for comparing standard cell heights which the present inventors have studied.

FIG. 8 is a plan view of principal portions which is for making comparison among the cell height of standard cells arranged at an integer multiple of wiring pitch ((an integer+1)×wiring pitch), that of standard cells arranged at (an integer+0.5)×wiring pitch, and that of standard cells arranged at (an integer+0.25)×wiring pitch, assuming that the number of second-layer wiring lines M2 able to pass between the first and second taps is six.

In case of arranging four standard cells in the direction orthogonal to the taps 100, the cell height of standard cells arranged at an integer multiple of wiring pitch is (4×7) wiring pitch=28 wiring pitch. The cell height of standard cells arranged at (an integer+0.5)×wiring pitch is (4×6.5) wiring pitch=26 wiring pitch. Further, the cell height of standard cells arranged at (an integer+0.25)×wiring pitch is (4×6.25) wiring pitch=25 wiring pitch.

Therefore, a comparison of wiring pitches with respect to four standard cells shows that the standard cells arranged at (an integer+0.25)×wiring pitch and the standard cells arranged at (an integer+0.5)×wiring pitch can be made smaller in cell height by 3 wiring pitch and 2 wiring pitch, respectively, than the standard cells arranged at an integer multiple of wiring pitch. Likewise, a comparison of areas with respect to four standard cells shows that the standard cells arranged at (an integer+0.25)×wiring pitch and the standard cells arranged at (an integer multiple+0.5)×wiring pitch can be made smaller in cell area by about 11% and about 7%, respectively, than the standard cells arranged at an integer multiple of wiring pitch.

Although the present invention has been described above concretely by way of embodiments thereof, it goes without saying that the present invention is not limited to the above embodiments, but that various changes may be made within the scope not departing from the gist of the invention.

For example, although in the above embodiments the gate electrodes of pMIS and nMIS are each formed by a polycrystalline silicon film, no limitation is made thereto, but they may be formed, for example, by a metallic film. This metallic film may be, for example, Ti, TiN, Pt, or Al film.

Further, although in the above embodiments the gate insulating film is formed by silicon oxide film, no limitation is made thereto. For example, it may be formed by a film having a dielectric constant higher than that of the silicon nitride film. As examples of such a high dielectric constant film there are mentioned films of HfO, HfAlO, HfSiAlO, HfSiO, ZrO, ZrAlO, ZrSiO, LaO, LaSiO, TaO, and TiO.

The semiconductor integrated circuit device of the present invention is applicable to a semiconductor integrated circuit device having an integrated circuit formed by standard cells highly reduced in size.

What is claimed is:

1. A semiconductor integrated circuit device comprising:
    a first tap for the supply of a first potential, the first tap being formed in a first direction;
    a second tap for the supply of a second potential, the second tap being formed in the first direction and positioned so as to confront the first tap in a second direction intersecting the first direction;
    a cell array comprising a plurality of standard cells each formed between the center of the first tap in the second direction and the center of the second tap in the second direction; and
    a plurality of layers of wiring lines formed over the first tap, the second tap and the cell array,
    wherein a cell height between the first and second taps is set to a value equal to the product of an integer representing a number of wiring lines in the first direction and increased by 0.5, and a wiring pitch of second-layer wiring lines of the plurality of layers of wiring lines.

2. A semiconductor integrated circuit device according to claim 1,
    wherein the integer is a number of the second-layer or higher-layer wiring lines formed in the first direction and able to pass between the first and second taps.

3. A semiconductor integrated circuit device according to claim 1,
    wherein the first potential is a power-supply potential and the second potential is a ground potential.

4. A semiconductor integrated circuit device according to claim 1,
    wherein the wiring pitch is a minimum wiring pitch obtained by adding together a wiring width and a wiring spacing each formed at a minimum machining size.

5. A semiconductor integrated circuit device according to claim 1,
    wherein the interior of each of the standard cells is wired by the first-layer wiring lines out of the plural layers of wiring lines.

6. A semiconductor integrated circuit device according to claim 1,
    wherein the cell array includes a plurality of the standard cells, the standard cells being coupled to each other by the second-layer or higher-layer wiring lines.

* * * * *